(12) United States Patent
Flachowsky et al.

(10) Patent No.: US 10,056,376 B2
(45) Date of Patent: Aug. 21, 2018

(54) FERROELECTRIC FINFET

(71) Applicant: GLOBALFOUNDRIES Inc., Grand Cayman (KY)

(72) Inventors: Stefan Flachowsky, Dresden (DE); Ralf Illgen, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 37 days.

(21) Appl. No.: 15/238,023

(22) Filed: Aug. 16, 2016

(65) Prior Publication Data

US 2016/0358915 A1  Dec. 8, 2016

Related U.S. Application Data

(62) Division of application No. 14/640,151, filed on Mar. 6, 2015, now Pat. No. 9,449,972.

(51) Int. Cl.

| | | |
|---|---|---|
| *H01L 27/088* | (2006.01) | |
| *H01L 29/423* | (2006.01) | |
| *H01L 29/51* | (2006.01) | |
| *H01L 29/66* | (2006.01) | |
| *H01L 29/78* | (2006.01) | |
| *H01L 21/28* | (2006.01) | |
| *H01L 21/8234* | (2006.01) | |

(52) U.S. Cl.
CPC .... *H01L 27/0886* (2013.01); *H01L 21/28291* (2013.01); *H01L 29/42364* (2013.01); *H01L 29/512* (2013.01); *H01L 29/516* (2013.01); *H01L 29/517* (2013.01); *H01L 29/518* (2013.01); *H01L 29/6684* (2013.01); *H01L 29/66553* (2013.01); *H01L 29/7851* (2013.01); *H01L 29/78391* (2014.09); *H01L 21/823431* (2013.01); *H01L 21/823462* (2013.01)

(58) Field of Classification Search
CPC .......... H01L 21/28291; H01L 27/0886; H01L 29/42364; H01L 29/516; H01L 29/6684; H01L 29/78391; H01L 29/66553
See application file for complete search history.

(56) References Cited

U.S. PATENT DOCUMENTS

| | | | |
|---|---|---|---|
| 6,262,451 B1 * | 7/2001 | Huang | H01L 21/2815 257/295 |
| 7,091,551 B1 * | 8/2006 | Anderson | G11C 16/0475 257/324 |
| 2009/0078997 A1 | 3/2009 | Greene et al. | |
| 2009/0261395 A1 | 10/2009 | Boescke | |
| 2011/0062518 A1 * | 3/2011 | Chan | H01L 29/66795 257/347 |
| 2011/0188288 A1 * | 8/2011 | Minami | G11C 11/22 365/145 |

(Continued)

*Primary Examiner* — Kevin Parendo
(74) *Attorney, Agent, or Firm* — Amerson Law Firm, PLLC (57) ABSTRACT

A semiconductor device includes a semiconductor substrate and a fin positioned above the semiconductor substrate, wherein the fin includes a semiconductor material. Additionally, a ferroelectric high-k spacer covers sidewall surfaces of the fin and a non-ferroelectric high-k material layer covers the ferroelectric high-k spacer and the fin, wherein a portion of the non-ferroelectric high-k material layer is positioned on and in direct contact with the semiconductor material at the upper surface of the fin.

19 Claims, 3 Drawing Sheets

(56) References Cited

U.S. PATENT DOCUMENTS

2015/0079750 A1 3/2015 Wang et al.
2015/0311349 A1* 10/2015 Ramaswamy ...... H01L 27/1159
                                                        257/295

* cited by examiner

FERROELECTRIC FINFET

BACKGROUND

1. Field of the Disclosure

Generally, the present disclosure relates to a semiconductor device, a semiconductor device structure, a method of forming a semiconductor device, and a method of forming a semiconductor device structure. Particularly, the present disclosure is directed to FinFET device structures having gate structures with ferroelectric high-k materials and non-ferroelectric high-k materials.

2. Description of the Related Art

In modern electronic equipment, integrated circuits (ICs) experience vast usage in a continuously spreading range of applications. In particular, the demand for increasing mobility of electronic devices at high performance and low energy consumption drives developments to more and more compact devices having features with sizes significantly smaller than 1 μm, the more so as current semiconductor technologies are apt of producing structures with dimensions in the magnitude of 100 nm or less. With ICs representing a set of electronic circuit elements integrated on a semiconductor material, normally silicon, ICs may be made much smaller than any discreet circuit composed of separate independent circuit components. Indeed, the majority of present-day ICs are implemented by using a plurality of circuit elements, such as field effect transistors (FETs), also called metal oxide semiconductor field effect transistors or MOSFETs, occasionally also simply referred to as MOS transistors, and passive elements, such as resistors, e.g., diffusion resistors, and capacitors, integrated on a semiconductor substrate within a given surface area. Typical present-day ICs involve millions of single circuit elements formed on a semiconductor substrate.

The basic function of a MOSFET is that of an electronic switching element which controls a current through a channel region provided between two junction regions which are referred to as source and drain. The control of the conductivity state of the channel region is achieved by means of a gate electrode being disposed over the channel region and to which gate electrode a voltage relative to source and drain is applied. In common planar MOSFETs, the channel region extends in a plane between source and drain. Generally, in applying a voltage exceeding a characteristic voltage level to the gate electrode, the conductivity state of the channel is changed and switching between a conducting state or "ON-state" and a non-conducting state or "OFF-state" may be achieved. It is important to note that the characteristic voltage level at which the conductivity state changes (usually called the "threshold voltage"), therefore, characterizes the switching behavior of the MOSFET, and it is generally an issue to keep variations in the threshold voltage level low when implementing a desired switching characteristic. However, with the threshold voltage depending non-trivially on the transistor's properties, e.g., materials, dimensions, etc., the implementation of a desired threshold voltage value during fabrication processes involves careful adjustment and fine tuning during the fabrication processes, which makes the fabrication of complex semiconductor devices by advanced technologies more and more difficult.

In general, it was observed that, with the sizes of individual MOSFETs having steadily decreased over the last decades, strongly scaled MOSFETs suffered more and more from undesirable effects once the length of the channel of a MOSFET entered the same order of magnitude as the width of the depletion layer of source and drain. For strongly scaled MOSFETs, for example, the OFF-state leakage current (i.e., the leakage current in the OFF-state) increased with the idle power required by the device. Accordingly, these deteriorating effects, which appear at small scales and are associated with a short channel length, are frequently referred to as so-called "short channel effects." In order to continue to lower scales, tremendous efforts are needed to address the issues or marginalities, variabilities and challenges appearing in scaling towards VLSI (very large scale integration) MOSFET technologies at, for instance, 20 nm or less, such that all the marginalities in each individual process step and all variabilities are properly addressed and, at best, reduced.

In the efforts of overcoming the above-described issues encountered when reaching smaller and smaller scales, multi-gate MOSFET devices have been proposed. A kind of multi-gate MOSFET device used for advanced 22/14 nm technologies is realized as a so-called "FinFET." In general, FinFETs represent three-dimensional transistors formed by thin fins extending upwardly from a semiconductor substrate, where particularly the transistor channel is three-dimensional. For example, in some designs of FinFET devices, the channel is formed along the vertical sidewalls of the fin (which is also referred to as a "double-gate transistor") or along the vertical sidewall surfaces and the upper horizontal surface of the fin (leading to so-called "tri-gate transistors"). Double-gate transistors and tri-gate transistors have wide channels and, on the other hand, high performance, which may be achieved without substantially increasing the area of the substrate surface required by these transistors because a transistor's performance, being measured by its transconductance, is proportional to the width of the transistor channel. Therefore, by the multi-gate configuration as provided by the three-dimensional channel of FinFETs, these semiconductor devices allow for a better control of the channel region when compared to common planar transistor devices.

Furthermore, due to the various efforts that were carried out to improve memory arrays, ferroelectric gate field effect transistors (FeFETs) have been recently in the focus of research. In general, ferroelectric materials typically have dielectric crystals which exhibit a spontaneous electric polarization similar to ferromagnetic materials having a spontaneous magnetization. Upon applying an appropriate external electric field to a ferroelectric material, the direction of polarization of the ferroelectric material may be reoriented. The basic idea is to use the direction of spontaneous polarization in ferroelectric memories for storing digital bits. In FeFETs, the effect that one makes use of is the possibility to adjust the polarization state of a ferroelectric material on the basis of appropriate electrical fields which are applied to the ferroelectric material which, in a FeFET, is usually the gate oxide. Since the polarization state of a ferroelectric material is preserved unless it is exposed to a high, with regard to the polarization state, counter oriented electrical field or a high temperature, it is possible to "program" a capacitor formed of ferroelectric material such that an induced polarization state reflects an information unit. Therefore, an induced polarization state is preserved, even upon removing an accordingly "programmed" device from a power supply. In this way, FeFETs allow the implementation of non-volatile electrically switchable data storage devices.

On the basis of ferroelectric materials, it is possible to provide non-volatile memory devices, particularly random excess memory devices similar in construction to DRAM devices, but differing in that a ferroelectric layer is used instead of a dielectric layer such that a non-volatile memory device is obtained. For example, the 1T-1C storage cell design in a FeRAM is similar in construction to the storage cell in widely used DRAM in that both cell types include one capacitor and one excess transistor—a linear dielectric is used in a DRAM cell capacitor, whereas in a FeRAM cell capacitor the dielectric structure includes a ferroelectric material. Other types of FeRAMs are realized as 1T storage cells which consist of a single FeFET employing a ferroelectric dielectric instead of the gate dielectric of common MOSFETs. The current-voltage characteristic between source and drain of a FeFET depends in general on the electric polarization of the ferroelectric dielectric, i.e., the FeFET is in the on or off state, depending on the orientation of the electric polarization state of the ferroelectric dielectric. Writing on a FeFET is achieved in applying a writing voltage to the gate relative to source, while a 1T-FeRAM is read out by measuring the current when applying a reading voltage to source and drain. It is noted that the reading out of a 1T-FeRAM is nondestructive.

Although a FeFET or a ferroelectric capacitor represent in theory very promising concepts for complex semiconductor devices, it is a difficult task to identify appropriate ferroelectric materials which are compatible with existing advanced manufacturing processes of complex devices, particularly at very small scales. For example, commonly known ferroelectric materials, such as PZT or perovskites, are not compatible with standard CMOS processes. According to present understanding, hafnium (Hf) based materials, which are often used in current fabrication technologies, exhibit a para-electric behavior due to the predominantly monoclinic crystal structure present in hafnium oxide. However, recent research results indicate that dielectric materials on the basis of hafnium oxide may represent promising candidates for materials with ferroelectric behavior to be used in the fabrication of ferroelectric semiconductor devices. It is, for example, known that the monoclinic structure may be suppressed in hafnium oxide materials doped with Zr, Si, Y or Al, wherein the crystal structures of ferroelectric nature may be stabilized.

In embedding FeFETs together with standard MOSFETs into existing process flows according to advanced CMOS techniques, ferroelectric semiconductor devices and non-ferroelectric semiconductor devices having different gate stack heights due to the height difference between the ferroelectric gate dielectric and the non-ferroelectric gate dielectric are formed. Especially in FinFET integration schemes, strong topographical differences appear after the gate formation between FeFET and MOSFET devices, causing problems in replacement gate processes, particularly at chemical mechanical polishing (CMP) steps.

It is, therefore, desirable to provide a semiconductor device that does not increase topography differences due to a ferroelectric gate dielectric. It is further desirable to provide a method of forming an according semiconductor device. Furthermore, it is desirable to provide a semiconductor device structure having ferroelectric and non-ferroelectric semiconductor devices which do not show strong topography variations. It is further desirable to provide a method of forming an according semiconductor device structure.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein is directed to various new and unique FinFET semiconductor devices and device structures with ferroelectric and non-ferroelectric high-k materials. In one illustrative embodiment, a semiconductor device includes a semiconductor substrate and a fin positioned above the semiconductor substrate, wherein the fin includes a semiconductor material. The illustrative device further includes, among other things, a ferroelectric high-k spacer covering sidewall surfaces of the fin and a non-ferroelectric high-k material layer covering the ferroelectric high-k spacer and the fin, wherein a portion of the non-ferroelectric high-k material layer is positioned on and in direct contact with the semiconductor material at the upper surface of the fin.

In another exemplary embodiment of the present disclosure, a semiconductor device includes, among other things, a semiconductor substrate, a fin positioned above a device region of the semiconductor substrate, and a ferroelectric high-k spacer positioned adjacent to sidewall surfaces of the fin, wherein the fin includes a semiconductor material. Furthermore, a cap layer is positioned on and in direct contact with the outer surface of the ferroelectric high-k spacer and a non-ferroelectric high-k material layer extends continuously over and covers the ferroelectric high-k spacer, the cap layer and the fin, wherein a portion of the non-ferroelectric high-k material layer is positioned on and in direct contact with the semiconductor material at the upper surface of the fin.

Also disclosed herein is an illustrative semiconductor device structure that includes a semiconductor substrate, a first semiconductor device positioned over a first region of the semiconductor substrate and a second semiconductor device positioned over a second region of the semiconductor substrate. The first semiconductor device includes, among other things, a first fin, a ferroelectric high-k spacer covering sidewall surfaces of the first fin, a first non-ferroelectric high-k material layer covering the ferroelectric high-k spacer and the upper surface of the first fin, and a cap layer positioned between the ferroelectric high-k spacer and the first non-ferroelectric high-k material layer. Additionally, the second semiconductor device includes a second fin and a second non-ferroelectric high-k material layer covering sidewall and upper surfaces of the second fin. Furthermore, a first height level, relative to the upper surface of the semiconductor substrate, of the upper surface of a portion of the first non-ferroelectric high-k material layer that covers the upper surface of the first fin is substantially equal to a second height level, relative to the upper surface of the semiconductor substrate, of a portion of the second non-ferroelectric high-k material layer that covers the upper surface of the second fin.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the claimed invention to the particular forms disclosed, but on the contrary, the intention is to cover all modifications, equivalents, and alternatives falling within the spirit and scope of the claimed invention.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a semiconductor device and to the resulting semiconductor devices, wherein the resulting semiconductor devices may be integrated on or in a chip. In accordance with some illustrative embodiments of the present disclosure, the semiconductor devices may substantially represent FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor devices of the present disclosure concern devices which are fabricated by using advanced technologies, i.e., the semiconductor devices are fabricated by technologies applied to approach technology nodes smaller than 100 nm, for example, smaller than 50 nm or smaller than 35 nm. The person skilled in the art will appreciate that, according to the present disclosure, ground rules smaller or equal to 45 nm may be imposed. The person skilled in the art will appreciate that the present disclosure proposes semiconductor devices with structures of minimal length dimensions and/or width dimensions smaller than 100 nm, for example, smaller than 50 nm or smaller than 35 nm. For example, the present disclosure may provide semiconductor devices fabricated by using 45 nm technologies or below, e.g., 28 nm or even below.

The person skilled in the art will appreciate that semiconductor devices may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

Some embodiments of the present disclosure provide a semiconductor device having a semiconductor substrate and a gate structure formed over the semiconductor substrate, the gate structure may include, among other things, a fin and a ferroelectric high-k material formed at least over sidewall surfaces of the fin. In such embodiments, a first thickness that is defined by a thickness of the ferroelectric high-k material formed over the sidewalls of the fin is substantially greater than a second thickness that is defined by a thickness of the ferroelectric high-k material formed over an upper surface of the fin. Accordingly, the disclosed semiconductor device allows reducing variations in the topography caused by an additional layer of ferroelectric high-k material that may be disposed on an upper surface of the fin by forming the ferroelectric high-k material having a first thickness over the sidewalls of the fin and a second thickness over the upper surface of the fin, wherein the second thickness is smaller than the first thickness.

In accordance with some illustrative embodiments, the second thickness may be substantially zero, and the ferroelectric high-k material may be only formed over the sidewall surfaces of the fin. In such embodiments, the non-ferroelectric high-k material may be formed directly on the upper surface of the fin. In accordance with some examples herein, the semiconductor device may further include a non-ferroelectric high-k material formed on the ferroelectric high-k material and the upper surface of the fin, in which case the height of the fin together with the non-ferroelectric high-k material may not depend on the thickness of the ferroelectric high-k material. In accordance with some special examples herein, a thickness of the non-ferroelectric high-k material may be substantially smaller than the first thickness. In accordance with other examples herein, the semiconductor device may further include a silicon oxide material positioned on the upper surface of the fin. In some special examples disclosed herein, a thickness of silicon oxide material may be substantially smaller than the first thickness.

In accordance with other illustrative embodiments, the semiconductor device may further include a non-ferroelectric high-k material having a third thickness formed on the ferroelectric high-k material, wherein the third thickness and the second thickness being together at most of about the first thickness.

In some aspects of the various disclosed embodiments, the ferroelectric high-k material may be formed by a ferroelectric hafnium oxide material. In some illustrative examples herein, the semiconductor device may further include a TiN material layer formed on the ferroelectric hafnium oxide material and a non-ferroelectric high-k material formed on the TiN material layer.

Certain other exemplary embodiments of the present disclosure provide a semiconductor device structure that includes a semiconductor substrate, a first semiconductor device with a first gate structure formed over a first region of the semiconductor substrate, wherein the first gate structure includes, among other things, a first fin, a ferroelectric high-k material formed at least on the sidewall surfaces of the first fin, and a first non-ferroelectric high-k material formed on the ferroelectric high-k material. Additionally, illustrative semiconductor device structure may also include a second semiconductor device with a second gate structure formed over a second region of the semiconductor substrate, wherein the second gate structure includes a second fin and a second non-ferroelectric high-k material formed on the second fin. Furthermore, the first and second gate structures may be of substantially equal height relative to the semiconductor substrate.

In accordance with certain illustrative embodiments, the first semiconductor device may represent a storage device, e.g., FeRAM devices, and the second semiconductor devices may represent at least one of a logic device and an SRAM device of an integrated circuit structure that is positioned over the semiconductor substrate.

In accordance with some illustrative aspects of the disclosed subject matter, the first and second non-ferroelectric high-k materials may be substantially the same material.

In certain illustrative embodiments, the non-ferroelectric high-k material may be positioned on an upper surface of the first fin.

In accordance with further exemplary embodiments, the disclosed semiconductor device structure may further include a third gate structure that is positioned over the first region and a fourth gate structure that is positioned over the second region, wherein a separation between the first and third gate structures is substantially smaller than a separation between the second and fourth gate structures.

Certain illustrative aspects of the present disclosure provide a method of forming a semiconductor device, wherein the method includes forming a fin over a semiconductor substrate, forming a ferroelectric high-k material over the fin, anisotropically etching the ferroelectric high-k material, and depositing a non-ferroelectric high-k material over the etched ferroelectric high-k material.

In accordance with some illustrative embodiments, anisotropically etching the ferroelectric high-k material may include performing a reactive ion etching (RIE) step.

In at least some exemplary embodiments, the ferroelectric high-k material may be removed from an upper surface of the fin during the anisotropically etching step so as to expose the upper surface of the fin.

In certain other illustrative aspects of the present disclosure, a method of forming a semiconductor device structure is provided, wherein the method includes, among other things forming at least one first fin over a first region of a semiconductor substrate, forming at least one second fin over a second region of the semiconductor substrate, forming a ferroelectric high-k material over the at least one first fin, anisotropically etching the ferroelectric high-k material, and depositing a non-ferroelectric high-k material over the first and second regions, wherein the non-ferroelectric high-k material is formed over the ferroelectric high-k material over the at least one first fin and on the at least one second fin.

In accordance with some illustrative embodiments, the disclosed method may further include forming a mask pattern over the first and second regions, the mask pattern covering the second region before the ferroelectric high-k material is formed over the at least one first fin.

In at least some exemplary embodiments, a plurality of first fins and a plurality of second fins may be formed, wherein the first fins have a greater pitch than the second fins.

Figure 1A:
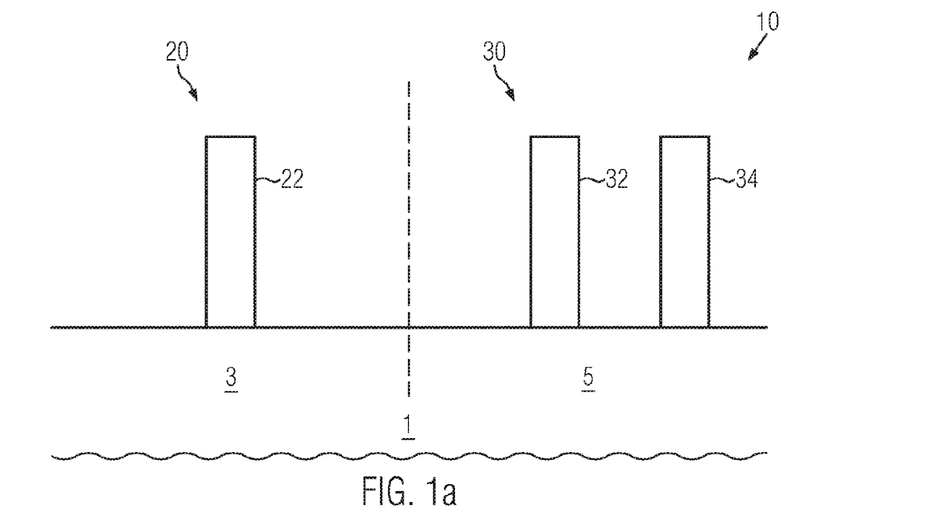
FIGS. 1a-1f schematically illustrate in cross-sectional views a semiconductor device structure in accordance with some illustrative embodiments of the present disclosure at various stages during fabrication.

FIG. 1a schematically illustrates, in a cross-sectional view, a semiconductor device structure 10 formed in and over a semiconductor substrate 1. The semiconductor substrate 1 may be a semiconductor bulk substrate or a semiconductor-on-insulator (SOI) substrate or a silicon/germanium-on-insulator (SGOI) substrate. In general, the terms "substrate," "semiconductor substrate" or "semiconducting substrate" should be understood as to cover all semiconductor materials, in all forms of such semiconductor materials, and no limitation to a special kind of substrate is intended. The person skilled in the art will appreciate that, in some illustrative embodiments, the substrate may represent an SOI substrate configuration including a thin silicon film (not illustrated) disposed on a buried oxide or BOX layer (not illustrated), which in turn is formed on a substrate base or base wafer (not illustrated). Herein, the upper portion of the SOI substrate as schematically illustrated in FIG. 1a may, for example, correspond to the thin silicon film.

Referring to FIG. 1a, the semiconductor device structure 10 includes a semiconductor device 20 and a semiconductor device 30. The semiconductor device 20 is formed in and over a region 3 of the semiconductor substrate 1, while the semiconductor device 30 is formed in and over a region 5 of the semiconductor substrate 1. The region 3 and the region 5 represent portions of the semiconductor substrate 1 which may be, in accordance with some illustrative embodiments herein, doped with a certain dopant in order to form a pre-doped well, such as a P-well or an N-well. Additionally or alternatively, the regions 3 and 5 may represent surface regions of the semiconductor substrate 1 which are located adjacent to each other, optionally separated by an insulating structure, such as a shallow trench isolation (STI, not illustrated). This does not pose any limitation to the present disclosure and the person skilled in the art will appreciate that the regions 3 and 5 may be separated by one or more device regions (not illustrated) formed in between. The semiconductor device 20 has a fin 22 formed on and extending away from an upper surface of the region 3. The semiconductor device 30 has a fin 32 and a fin 34 formed on and extending away from an upper surface of the region 5. In accordance with some illustrative embodiments of the present disclosure, the region 3 may represent a region in and on which one or more storage devices, e.g., one or more FeRAM devices, are to be formed. Additionally or alternatively, the region 5 may represent a region in and over which one or more logic devices and/or SRAM devices are to be formed.

Below, some illustrative embodiments of the present disclosure will be described in greater detail and with regard to the enclosed figures, wherein a ferroelectric FinFET is formed.

Figure 1B:
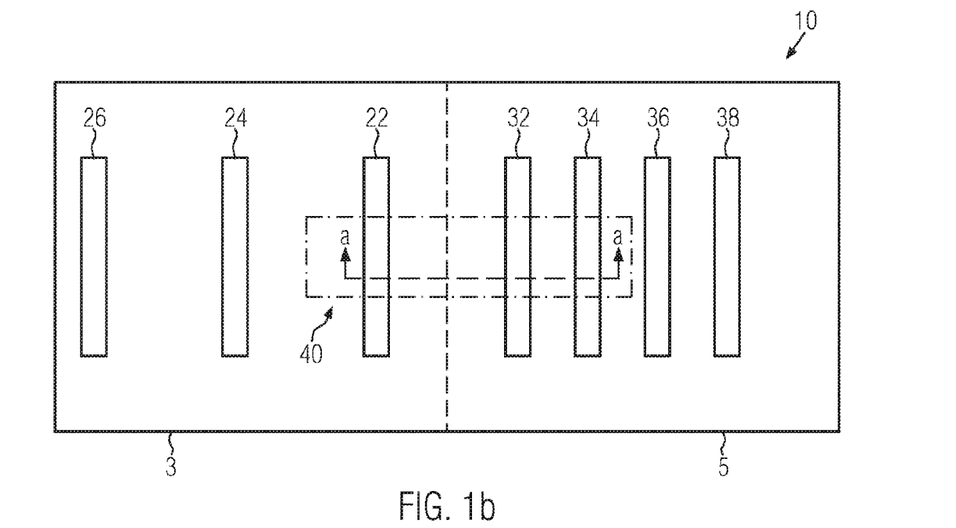

FIG. 1b schematically shows a top view of a portion of the upper surface of the semiconductor substrate 1 schematically illustrating the regions 3 and 5. As it is visible from FIG. 1b, the fin 22 may be part of a plurality of fins 22, 24, 26 formed in the region 3, while the fins 32, 34 may be part of a plurality of fins 32, 34, 36 and 38 in the region 5. The cross-section as illustrated in FIG. 1a is schematically indicated by line a-a in FIG. 1b.

Referring back to FIG. 1a, the semiconductor devices 20, 30 may be formed in accordance with known techniques for forming fins in at an upper surface of a semiconductor substrate, such as by patterning a trench structure on an upper surface of a semiconductor substrate, etching trenches in accordance with the trench structure into the upper surface of the semiconductor substrate and, optionally, filling the trenches by an insulating material for adjusting an effective height of fins which are delimitated by the trenches.

With regard to the semiconductor device structure 10 as depicted in FIG. 1a, the person skilled in the art will appreciate that a masking pattern (not illustrated) used for patterning the semiconductor devices 20, 30 may be formed by two mask pattern portions for successively patterning in each region a fin structure corresponding to the plurality of fins 22, 24 and 26 in region 3 and the plurality of fins 32, 34, 36 and 38 in region 5. The person skilled in the art will appreciate that a pitch corresponding to the semiconductor device 20 may differ from the pitch of the semiconductor device 30. In accordance with some illustrative examples herein, the pitch of the semiconductor device 20 may be greater than the pitch of the semiconductor device 30 such that a distance between neighboring fins of the semiconductor device 20 may be 1.5 times a separation of neighboring fins of the semiconductor device 30 or more.

Next, a mask structure 40 for patterning a gate electrode may be formed, as it is illustrated in FIG. 1b. The mask structure 40 partially covers the region 3 and/or the region 5, such that a gate structure (not illustrated) may be formed over at least one of the fins of the semiconductor device 20 and/or at least one of the fins of the semiconductor device 30.

With regard to FIG. 1b, an illustrative embodiment of the present disclosure is schematically depicted, wherein the mask structure 40 extends transversely to the fins 22, 32 and 34, and partially exposes each of the fins 22, 32 and 34.

Figure 1C:
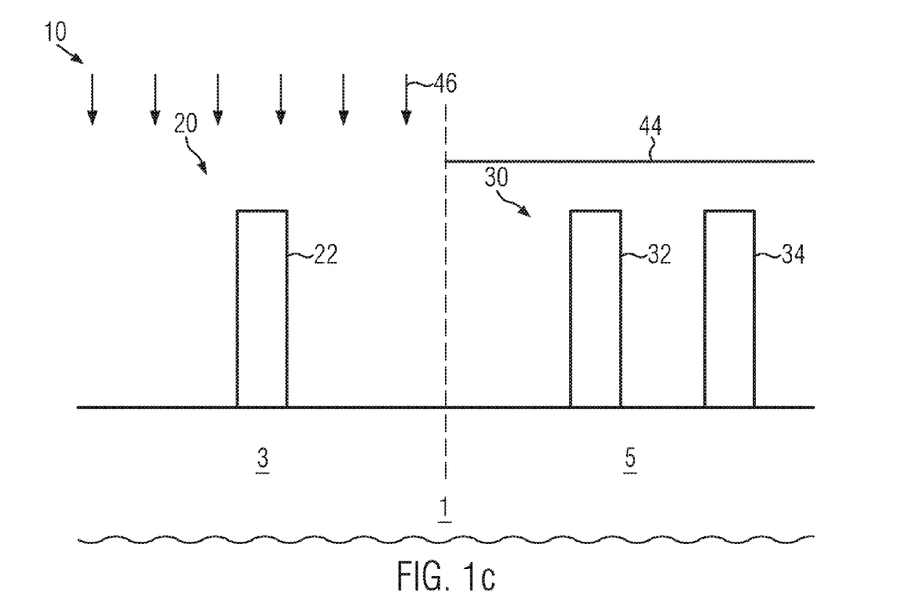

Referring to FIG. 1c, the semiconductor device structure 10 is schematically illustrated at a more advanced stage during fabrication, after a further masking pattern 44 is formed over the semiconductor substrate 10 such that the portion of the semiconductor device 20 being exposed by the mask pattern 40 remains at least partially exposed, while the semiconductor device 30 is covered. The person skilled in the art will appreciate that at least a portion of the fin 22 of the semiconductor device 20 is exposed by the mask pattern 40 and the mask structure 44, while the semiconductor device 30 and, particularly, the fins 32 and 34 are covered. Next, as illustrated in FIG. 1c, a process 46 is performed for forming a ferroelectric material layer 24 (see FIG. 1d) over the region 3, which is over the fin 22.

In accordance with some illustrative embodiments herein, the ferroelectric material layer 24 may be formed by depositing a ferroelectric material over the region 3. For example, the ferroelectric material may be formed by a ferroelectric hafnium oxide material. The person skilled in the art will appreciate that a cap layer (not illustrated), e.g. formed by TiN, may be formed on the ferroelectric material such that a ferroelectric phase of the ferroelectric material is stabilized during further processing. In accordance with an illustrative example, the ferroelectric material layer 24 may be formed by depositing hafnium, optionally doped with one of Si and Y and Zr, being covered by a cap material, e.g. TiN, and exposed to an annealing step (not illustrated) for activating the ferroelectric phase. For example, a cap material (not illustrated) may be formed with a thickness of about 10 nm or less.

Figure 1D:
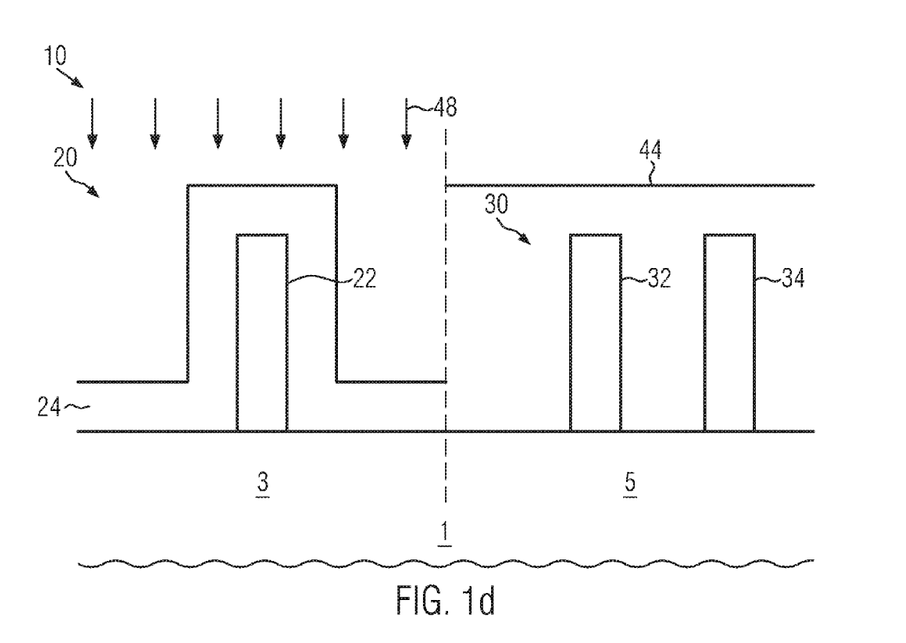

Referring to FIG. 1d, the semiconductor device structure 10 is schematically illustrated in a cross-sectional view at a more advanced stage during fabrication, in which a stage process 48 is performed. The process 48 may include an anisotropic etching to which the semiconductor device 20 is exposed for anisotropically etching the ferroelectric material layer 24, e.g., an RIE process. The person skilled in the art will appreciate that the semiconductor device 30 is protected from the process 48 by the masking pattern 44.

Figure 1E:
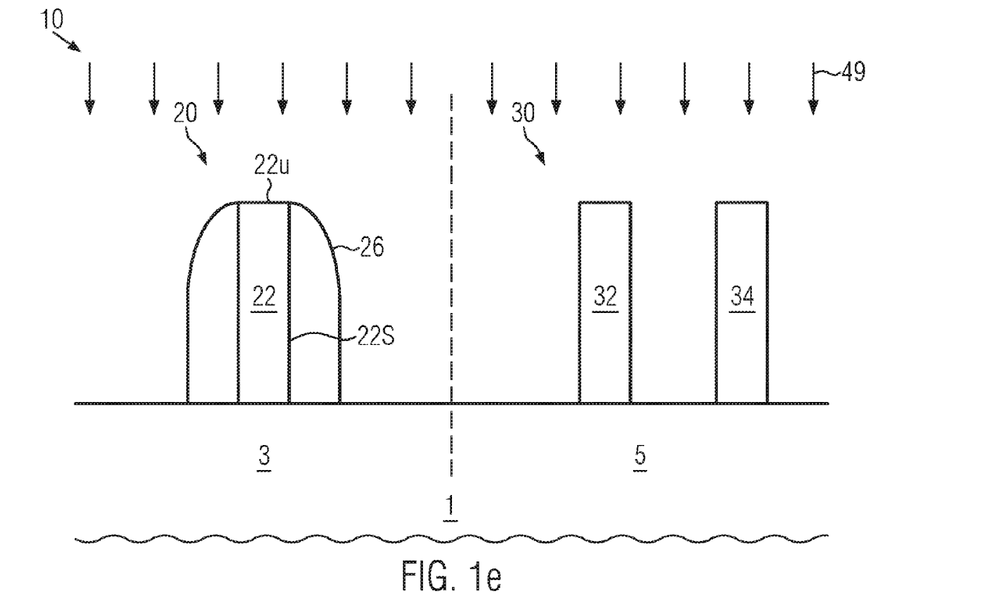

Referring to FIG. 1e, the semiconductor device structure 10 is schematically illustrated at a more advanced stage during fabrication, particularly after the process 48 is completed, the masking pattern 44 is removed and a process 49 is performed. The person skilled in the art will appreciate that after the process 48 is completed, the semiconductor device 20 as illustrated in FIG. 1e is obtained. Herein, the ferroelectric material layer 24 (see FIG. 1d) is anisotropically etched to result in the ferroelectric sidewall spacer 26 covering sidewalls 22s of the fin 22, while an upper surface 22u of the fin 22 is at least partially exposed.

Figure 1F:
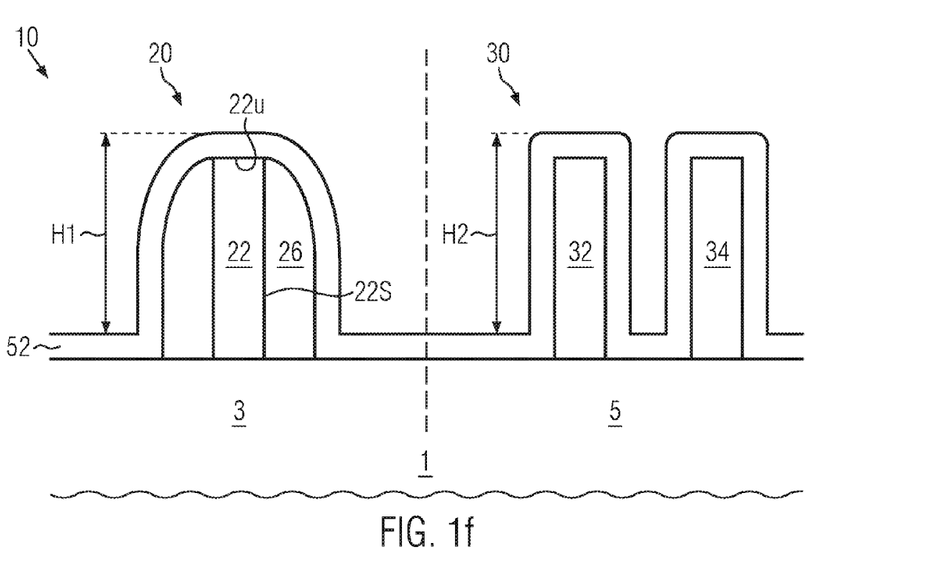

In accordance with some illustrative embodiments of the present disclosure, the process 49 may include a deposition process for depositing a non-ferroelectric high-k material 52 over the regions 3 and 5 such that the semiconductor devices 20, 30 are covered by the non-ferroelectric high-k material 52, as illustrated in FIG. 1f. The person skilled in the art will appreciate that upon depositing the non-ferroelectric material over the fin 22 and the fins 32, 34, i.e. on the upper surface 22u of the fin 22, a height level H1 of the gate structure provided by the ferroelectric high-k spacer 26, the fin 22 and the non-ferroelectric high-k material 52 over the region 3 is substantially maintained equal to a height level H2 of gate structures formed by the fins 32, 34 and the non-ferroelectric high-k material 52. The expression "substantially equal" is to be understood as H2<1.5×H1, i.e., H2<1.2×H1 or H2<H1×1.1, e.g., H2<1.05×H1 or even H2<1.01×H1. Accordingly, the situation after formation of ferroelectric and non-ferroelectric high-k materials on the semiconductor devices 20, 30 does not lead to strong topographical differences between the semiconductor devices 20, 30, and, therefore, issues during subsequent CMP processes, e.g. at a subsequent RMG process, are avoided.

With regard to FIGS. 1a-1f, a process flow for fabricating a semiconductor device structure 10 is described in accordance with some illustrative embodiments of the present disclosure, where semiconductor devices 20, 30 having a tri-gate configuration are formed. This does not pose any limitation on the present disclosure and the person skilled in the art will appreciate that, in accordance with alternative embodiments, semiconductor devices having a double-gate configuration may be formed instead. In some illustrative examples herein, the process flow differs from the process as described with regard to the figures in that an additional step (not illustrated in the figures) of forming an insulating material, e.g., a silicon oxide material, on the upper surfaces of the fins is performed prior to the process 49 in FIG. 1e.

The person skilled in the art will appreciate that in accordance with some aspects of the present disclosure, shaped FeFETs for tri-gate integration are provided. The semiconductor devices of some aspects of the present disclosure may be incorporated in all FinFET technologies with embedded non-volatile memories, such as FeFETs. Opposed to conventional process flows in which FeFETs and standard CMOS devices are implemented at the same time and where different gate stack heights causing severe integration challenges are formed, it is proposed to build a FeFET with a ferroelectric layer not covering the entire fin, but only the sidewalls of the fin. Accordingly, a, for example, ten times thicker ferroelectric layer does not substantially increase the topography of a FeFET as compared to standard logic transistors, e.g., the semiconductor devices 30. As a result, the various methods of the present disclosure enable a much easier process integration without changing existing process steps.

In accordance with some explicit examples of the present disclosure, an illustrative method of forming a semiconductor device may start after conventional fin formation, either on bulk or SOI substrates (see FIG. 1a), by forming a mask pattern, e.g. by $Si_3N_4$, covering logic/SRAM areas, that is the non-ferroelectric device areas (e.g. the region 5 in FIG. 1c) may be formed. Next, a ferroelectric layer, for example having a thickness from about 5 nm to about 20 nm, and, for example comprising a hafnium oxide material with an optional doping by one of Al, Gd, Si, Y, Zr, La, etc., in order to modulate ferroelectric properties, may be deposited. The person skilled in the art will appreciate that, as the fin distance may be too small for such a thick layer, it might be necessary to use "double pitch" fins, in order to overcome potential intermediate space problems and to allow a conformal deposition of ferroelectric high-k material on both sides of the fin. Next, the ferroelectric layer may be anisotropically etched similar to conventional spacer formation techniques, e.g. by RIE, such that the top of the fin (i.e., the upper surface 22u), is at least partially exposed from the ferroelectric material (see semiconductor device 20 in FIG. 1e). After removing the mask structure covering the logical/SRAM areas, i.e. the region 5, a conventional high-k dielectric, e.g. hafnium oxide, and a metal gate may be deposited. In this way, a gate electrode covering channel regions provided by the fins 22, 32 and 34 may be formed and a controlled "switching" of the fins 22, 32 and 34 by a single gate contact is possible. The person skilled in the art will appreciate that the ferroelectric effect of the ferroelectric sidewall spacers 26 is herein inducing ferroelectric characteristic of the semiconductor device 20, wherein the ferroelectric characteristic increases with increasing aspect ratio. For example, for fins having an aspect ratio of 1:2 and more, e.g. 1:10, a sufficient ferroelectric characteristic may be achieved for the semiconductor device 20.

The person skilled in the art will appreciate that in accordance with some illustrative embodiments of the present disclosure, the resulting semiconductor device structure may have the same topography level as conventional process devices and, i.e., subsequent CMP steps are not affected by the presence of additional ferroelectric FinFETs.

The particular embodiments disclosed above are illustrative only, as the claimed invention may be modified and practiced in different but equivalent manners apparent to those skilled in the art having the benefit of the teachings herein. For example, the method steps set forth above may be performed in a different order. Furthermore, no limitations are intended by the details of construction or design herein shown, other than as described in the claims below. It is therefore evident that the particular embodiments disclosed above may be altered or modified and all such variations are considered within the scope and spirit of the claimed invention. Accordingly, the protection sought herein is as set forth in the claims below.

What is claimed:

1. A semiconductor device, comprising:
   a semiconductor substrate;
   a fin positioned above said semiconductor substrate, said fin comprising a semiconductor material;
   a ferroelectric high-k spacer covering sidewall surfaces of said fin;
   a non-ferroelectric high-k material layer covering said ferroelectric high-k spacer and said fin, wherein a portion of said non-ferroelectric high-k material layer is positioned on and in direct contact with said semiconductor material at an upper surface of said fin; and
   a cap layer positioned between said ferroelectric high-k spacer and said non-ferroelectric high-k material layer.

2. The semiconductor device of claim 1, wherein said non-ferroelectric high-k material layer extends continuously over said ferroelectric high-k spacer and said upper surface of said fin.

3. The semiconductor device of claim 1, wherein a thickness of said non-ferroelectric high-k material layer is less than a thickness of said ferroelectric high-k spacer.

4. The semiconductor device of claim 1, wherein said cap layer is positioned on and in direct contact with said ferroelectric high-k spacer.

5. The semiconductor device of claim 1, wherein said cap layer comprises titanium nitride.

6. The semiconductor device of claim 1, wherein said ferroelectric high-k spacer comprises hafnium oxide.

7. The semiconductor device of claim 1, wherein said fin is a first fin positioned over a first region of said semiconductor substrate, the semiconductor device further comprising a second fin positioned over a second region of said semiconductor substrate, said non-ferroelectric high-k material layer continuously covering sidewall and upper surfaces of said second fin.

8. The semiconductor device of claim 7, wherein said non-ferroelectric high-k material layer is positioned on and in direct contact with at least one of said sidewall surfaces and said upper surface of said second fin.

9. The semiconductor device of claim 7, further comprising a silicon oxide material positioned between said second fin and said non-ferroelectric high-k material layer.

10. The semiconductor device of claim 7, wherein a height level, relative to an upper surface of said semiconductor substrate, of an upper surface of said portion of said non-ferroelectric high-k material layer that is positioned on and in direct contact with said upper surface of said first fin is substantially equal to a height level, relative to said upper surface of said semiconductor substrate, of a second portion of said non-ferroelectric high-k material layer covering said upper surface of said second fin.

11. A semiconductor device, comprising:
    a semiconductor substrate;
    a fin positioned above a device region of said semiconductor substrate, said fin comprising a semiconductor material;
    a ferroelectric high-k spacer positioned adjacent to sidewall surfaces of said fin;
    a cap layer positioned on and in direct contact with an outer surface of said ferroelectric high-k spacer; and
    a non-ferroelectric high-k material layer extending continuously over and covering said ferroelectric high-k spacer, said cap layer and said fin, wherein a portion of said non-ferroelectric high-k material layer is positioned on and in direct contact with said semiconductor material at an upper surface of said fin.

12. The semiconductor device of claim 11, wherein said ferroelectric high-k spacer comprises hafnium oxide.

13. The semiconductor device of claim 11, wherein said cap layer comprises titanium nitride.

14. The semiconductor device of claim 11, wherein said ferroelectric high-k spacer covers an entirety of said sidewall surfaces of said fin.

15. A semiconductor device structure, comprising:
a semiconductor substrate;
a first semiconductor device positioned over a first region of said semiconductor substrate, said first semiconductor device comprising:
 a first fin;
 a ferroelectric high-k spacer covering sidewall surfaces of said first fin;
 a first non-ferroelectric high-k material layer covering said ferroelectric high-k spacer and an upper surface of said first fin; and
 a cap layer positioned between said ferroelectric high-k spacer and said first non-ferroelectric high-k material layer; and
a second semiconductor device positioned over a second region of said semiconductor substrate, said second semiconductor device comprising:
 a second fin; and
 a second non-ferroelectric high-k material layer covering sidewall and upper surfaces of said second fin, wherein a first height level, relative to an upper surface of said semiconductor substrate, of an upper surface of a portion of said first non-ferroelectric high-k material layer that covers said upper surface of said first fin is substantially equal to a second height level, relative to said upper surface of said semiconductor substrate, of a portion of said second non-ferroelectric high-k material layer that covers said upper surface of said second fin.

16. The semiconductor device structure of claim 15, wherein said first semiconductor device represents a storage device and said second semiconductor device represents at least one of a logic device and an SRAM device of an integrated circuit structure.

17. The semiconductor device structure of claim 15, wherein said first and second non-ferroelectric high-k material layers each comprise a same high-k material.

18. The semiconductor device structure of claim 15, wherein said first non-ferroelectric high-k material layer is positioned on and in direct contact with said upper surface of said first fin.

19. The semiconductor device structure of claim 15, further comprising a silicon oxide material positioned between said first non-ferroelectric high-k material layer and said upper surface of said first fin and between said second non-ferroelectric high-k material layer and said upper surface of said second fin.

* * * * *